Nov. 24, 1964 L. L. JASPER 3,158,759

SYSTEM FOR SAMPLING, HOLDING AND COMPARING CONSECUTIVE ANALOG SIGNALS

Filed Oct. 31, 1962 2 Sheets-Sheet 1

INVENTOR
LESLIE L. JASPER

BY Melvin Sharp

INVENTOR
LESLIE L. JASPER
BY
Melvin Sharp

United States Patent Office 3,158,759
Patented Nov. 24, 1964

3,158,759

SYSTEM FOR SAMPLING, HOLDING AND COMPARING CONSECUTIVE ANALOG SIGNALS

Leslie L. Jasper, Houston, Tex., assignor to Texas Instruments Incorporated, Dallas, Tex., a corporation of Delaware Filed Oct. 31, 1962, Ser. No. 234,359
2 Claims. (Cl. 307—88.5)

The invention relates to a system for comparing analog signals and more particularly to a system capable of performing sample, hold and compare functions.

The invention relates to a system having two modes of operation, sample and compare. In the sample mode, a first analog signal is sampled and scored (hold) so that it may be utilized as a reference signal in the compare mode. In the compare mode, said reference signal is compared to a second analog signal producing an output whose polarity is indicative of which signal is greater and whose magnitude is proportional to the extent of the difference between said first and second signals. The sample, hold and compare circuitry are combined to minimize the problems of linearity, D.C. stabilization and bandwidth. Therefore, a compare amplifier is utilized in the sample mode as a low gain amplifier for passing the first analog signal for storage purposes. In the compare mode, said amplifier is utilized as a high gain differential amplifier for comparing a second analog signal with the first analog signal. Thus the compare amplifier is utilized in both the sample and compare modes. This is accomplished by providing a feedback loop to force said amplifier to operate as a low gain amplifier in the sample mode and disconnecting said feedback loop in the compare mode to allow said amplifier to operate as a high gain differential amplifier.

The invention may be used to compare two analog voltages or currents either A.C. or D.C. such as a known and an unknown voltage. Furthermore, the invention may be used in conjunction with an analog-to-digital converter for performing sample, hold and compare functions in said converter. The invention is applicable to any type of analog-to-digital converter including the sweep and step counter types, and in particular, the successive approximation type because of its high speed characteristic.

Accordingly, an object of the invention is to provide an improved system for comparing analog signals.

Another object of the invention is to provide a system which utilizes a comparing amplifier in high and low gain modes of operation to minimize problems of linearity, D.C. stabilization and bandwidth.

Another object of the invention is to provide a system for comparing analog signals capable of performing sample, hold and compare functions in which a differential amplifier is utilized in both the sample and compare modes of system operation.

Another object of the invention is to provide a system capable of performing sample, hold and compare functions and having two modes of operation in which a switch, a low gain amplifier and a storing means are utilized in one mode and said amplifier is modified to operate as a high gain differential amplifier in the other mode.

Another object of the invention is to provide a system capable of performing sample, hold and compare functions and having two modes of operation in which switching means, an input amplifier, a high gain differential amplifier having a feedback loop and a storage means are utilized in one or in both of said modes of operation.

The foregoing and other objects, features and advantages of the invention will be apparent to one skilled in the art from the folowing detailed description taken in connection with the appended claims and attached drawings in which:

In FIGS. 1–3, like numerals denote similar components having the same functions.

Figure 1:
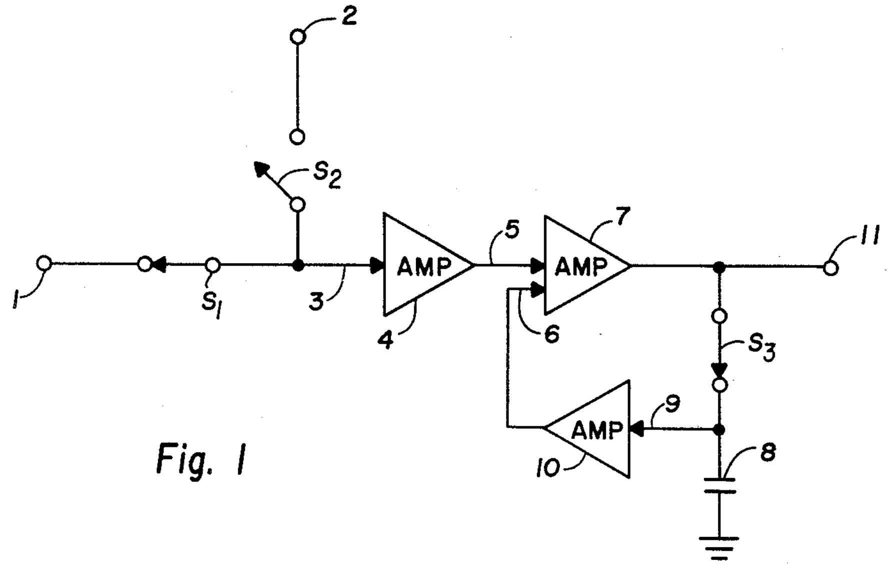
FIG.1 shows one embodiment of the invention.

Referring to FIG.1, the switches are shown in the sample mode, switches $S_1$ and $S_3$ are closed, and switch $S_2$ is open. The two analog signals to be compared are applied respectively to terminals 1 and 2. The signal applied to terminal 1 is sampled by switch $S_1$ and coupled to amplifier 4 whose output is coupled to the input 5 of amplifier 7. The feedback loop, $S_3$ and amplifier 10, couples the output of amplifier 7 to its input 6 forcing the amplifier to operate as a low gain device. Therefore, the signal applied to input 5 is passed to the output of amplifier 7 and stored and held by capacitor 8. In the compare mode, switches $S_1$ and $S_3$ are open and switch $S_2$ is closed. The feedback loop is now disconnected and amplifier 7 is allowed to operate as a high gain differential amplifier. In the compare mode, the signal applied to terminal 2 is sampled by switch $S_2$, coupled to amplifier 4 and applied to input 5. The signal stored by capacitor 8 is coupled to input 6 by amplifier 10. Amplifier 7 now produces an output which is the difference between the inputs at 5 and 6. Said output at terminal 11 has a polarity which is indicative of which signal at input 5 or 6 is greater and has a magnitude proportional to the extent of the difference between said inputs.

The amplifier 4 has a high input impedance and a low output impedance for isolating the comparing amplifier 7 from switching transients in $S_1$ and $S_2$ and may be an emitter-follower transistor amplifier. The amplifier 10 may also be an emitter-follower transistor amplifier providing a high input impedance for capacitor 8.

Assume that unknown D.C. voltages $E_1$ and $E_2$ are applied to terminal 1 and 2 respectively and it is desired to produce an output signal whose polarity is indicative of which voltage is greater and whose magniture is proportional to the extent of their difference. $E_1$ is sampled by switch $S_1$ for a predetermined time and coupled to capacitor 8 by amplifier 4 and low gain amplifier 7 for charging said capacitor to a voltage representing $E_1$. The system is then placed in the compare mode. $E_2$ is coupled to input 5 by amplifier 4 and high gain differential amplifier 7 compares the voltages representing $E_1$ and $E_2$ at inputs 6 and 5 respectively. If $E_2$ is less than $E_1$, the output signal at terminal 11 is of one polarity, for example, negative and has a magnitude proportional to the extent of the amplitude difference between $E_1$ and $E_2$. If $E_2$ is greater than $E_1$, the output is positive.

Although the sample mode has been designated as switches $S_1$ and $S_3$ closed, and switch $S_2$ open, the system operation would be the same if the sample mode were designated as switches $S_2$ and $S_3$ closed, and switch $S_1$ open. The compare mode would then be switch $S_1$ closed and switches $S_2$ and $S_3$ open.

If it is desired to have the signal at input 5 of one polarity with respect to ground irrespective of signal polarity at terminal 1 or 2, a D.C. offset may be incorporated in the bias circuit of amplifier 4. Thus, bipolar signals applied to terminals 1 and 2 would be converted to uni-polar signals at input 5.

Figure 2:
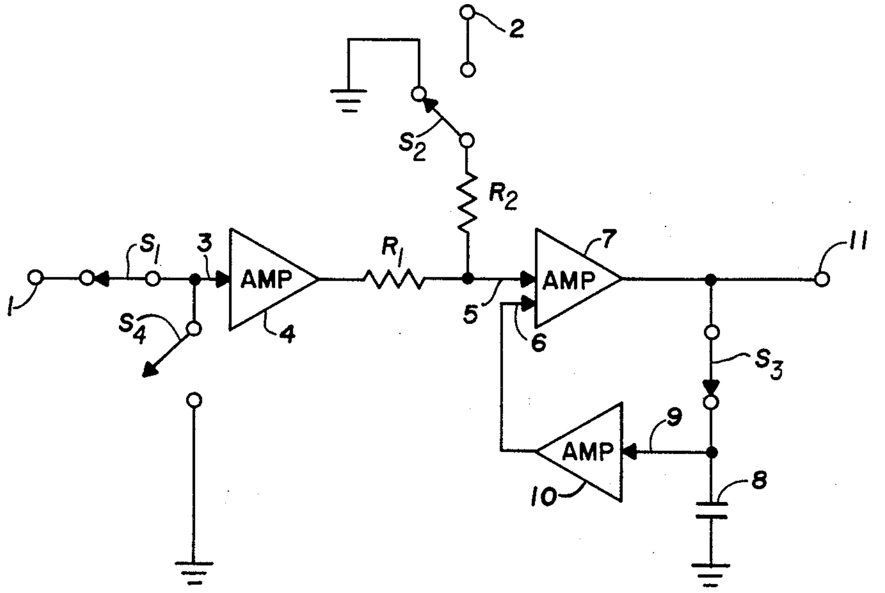
FIG. 2 shows another embodiment of the invention.

FIG. 2 shows another embodiment of the invention which operates in a similar manner as the system of FIG. 1; however, the signals to be compared are not both passed through the input amplifier 4. The switches $S_1$, $S_2$, $S_3$ and $S_4$ are shown positioned in the sample mode. The analog signal applied to terminal 1 is sampled by switch $S_1$, coupled to amplifier 4, and applied to one side of the voltage divider $R_1$, $R_2$. The other side of the voltage divider is shown connected to ground by switch $S_2$. The junction of the voltage divider is coupled to input 5 of amplifier 7 whose output is coupled to capacitor 8 for storage. The amplifier 7 operates as a low gain amplifier with its feedback loop closed as described in conjunction with FIG 1. In the compare mode, switches $S_1$ and $S_3$ are open, switch $S_4$ is closed and switch $S_2$ is connected to terminal 2. The voltage divider $R_1$, $R_2$ is now referenced to ground at said one side since switch $S_4$ connected to ground clamps the output of amplifier 4 to ground. The signal applied to terminal 2 is coupled by the voltage divider to input 5 where it is compared with the stored signal at input 6. The voltage divider $R_1$, $R_2$ with its reference connections to ground at one side or the other in either the sample or compare modes offers flexibility in converting bi-polar signals to uni-polar. Thus, any desired reference voltage may be applied to the unused side of the voltage divider for converting the signal at terminal 1 or 2 to a uni-polar signal at input 5. Additionally, a D.C. offset may be incorporated in amplifier 4 for converting the signal applied to terminal 1 from a bi-polar to uni-polar signal at input 5.

In certain applications the switch $S_2$ in the system of FIG. 2 may be eliminated and the terminal 2 may be connected directly to resistance $R_2$; for example, if the analog signal applied to terminal 2 during the sample mode is the output of a decoder which is a reference signal, such as ground for the sample period, then switch $S_2$ may be eliminated.

The application of the system shown in FIG. 1 to an analog-to-digital converter of the successive approximation type will be discussed. The system of FIG. 2 applies similarly.

In an analog-to-digital converter, the analog signal to be digitally coded is sampled for a predetermined time interval and stored; this corresponds to the sample mode. The stored signal is then used as a constant reference during the coding cycle, corresponding to the compare mode. During the coding cycle, the digit register in the encoding section is initially set to produce a zero voltage output from the decoder in the digital-to-analog section. The decoder output is applied to terminal 2 and the analog signal to be digitally coded is applied to terminal 1. A command pulse from the programmer places the system in the sample mode, switches $S_1$ and $S_3$ closed and switch $S_2$ open. The switches $S_1$, $S_2$ and $S_3$ may be transistor circuits activated or deactivated for a predetermined time period in response to a command pulse as is well-known in the art. The system operates, as previously described, to store the signal applied to terminal 1 on capacitor 8 for the predetermined sampling period. The system is now placed in the compare mode for the coding cycle in response to the presence or absence of a command pulse from the programmer to switches $S_1$, $S_2$ and $S_3$ for opening switches $S_1$ and $S_3$, and closing switch $S_2$ to connect terminal 2 to amplifier 4. The coding cycle comprises manipulating the decoder output at terminal 2 by a systematic procedure starting with the most significant bit (largest voltage increment) in the digit register and proceeding sequentially to the least significant bit whereby the two comparator inputs 5 and 6 are approximately equal. Assuming the stored voltage at input 6 is $E_1$ and the coding cycle is initiated, the initial voltage at terminal 2 is zero. The voltage $E_1$ at input 6 is greater than the voltage at input 5 and the output voltage at 11 is a predetermined polarity, for example, negative. The output signal at terminal 11 is applied to the digit register controls which respond to the output signal polarity to set a flip-flop in the digit register, that is, the output signal being negative in the first time increment, the flipflop designated bit 0 is left in its "1" state. In the next time increment, bit 1 is set to a "1" state raising the decoder output to the most significant bit. Assuming now that the voltage at input 5 is greater than the voltage $E_1$ at input 6, the output signal at terminal 11 is positive indicating that the voltage increment represented by the most significant bit 1 is too large. Therefore, bit 1 is removed, set to its "0" state, and bit 2 set to its "1" state. The bit 2 voltage increment (at the output of the decoder) is one-half that of bit 1. The decoder output representing the voltage increment of bit 2 is coupled to input 5 and compared to voltage $E_1$. If said voltage increment is less than $E_1$, the comparator output is negative leaving bit 2 in its "1" state. Bit 3 is then set to its "1" state in the next time increment increasing the decoder output by an amount equal to one-half the bit 2 voltage increment value. If the decoder output is too large, bit 3 is removed (set to "0") and bit 4 tried in the succeeding time increment. The remainder of the bits are tried in succession until the conversion is complete and the analog signal at input 6 is digitally approximated. If the sum of the voltage increment of a bit plus that due to all previous bits left in the digit register is greater than the held voltage $E_1$ at input 6, said bit is removed and the next bit tried; if said sum is less than or equal to the held voltage $E_1$, said bit is left in and the next bit tried.

In the example given, the digit register is initially set to provide a decoder output of zero volt or ground. Therefore, the switch $S_2$ in the system of FIG. 2 may be eliminated and the decoder output which is applied to terminal 2 may be directly coupled to resistance $R_2$. Referring to FIG. 2, in the sample mode, the voltage divider is ground referenced by the decoder output of zero volts applied to terminal 2 and the need for switch $S_2$ is eliminated. Accordingly, any known reference voltage applied to terminal 2 during the sample period obviates the need for switch $S_2$.

At the conclusion of the sampling period, switches $S_1$ and $S_3$ are opened, and switches $S_2$ and $S_4$ are closed. To prevent the charge on capacitor 8 from being affected by the transients resulting from the operation of switches $S_1$, $S_2$ and $S_4$, the operation of said switches may be delayed with respect to opening switch $S_3$.

If it is desired to amplify the compared output signal at terminal 11, a high gain differential amplifier similar to amplifier 7 may be used. One input of said differential amplifier would be coupled to terminal 11 and the other input coupled through an isolation circuit, such as an emitter-follower transistor, to the output of amplifier 10.

Figure 3:
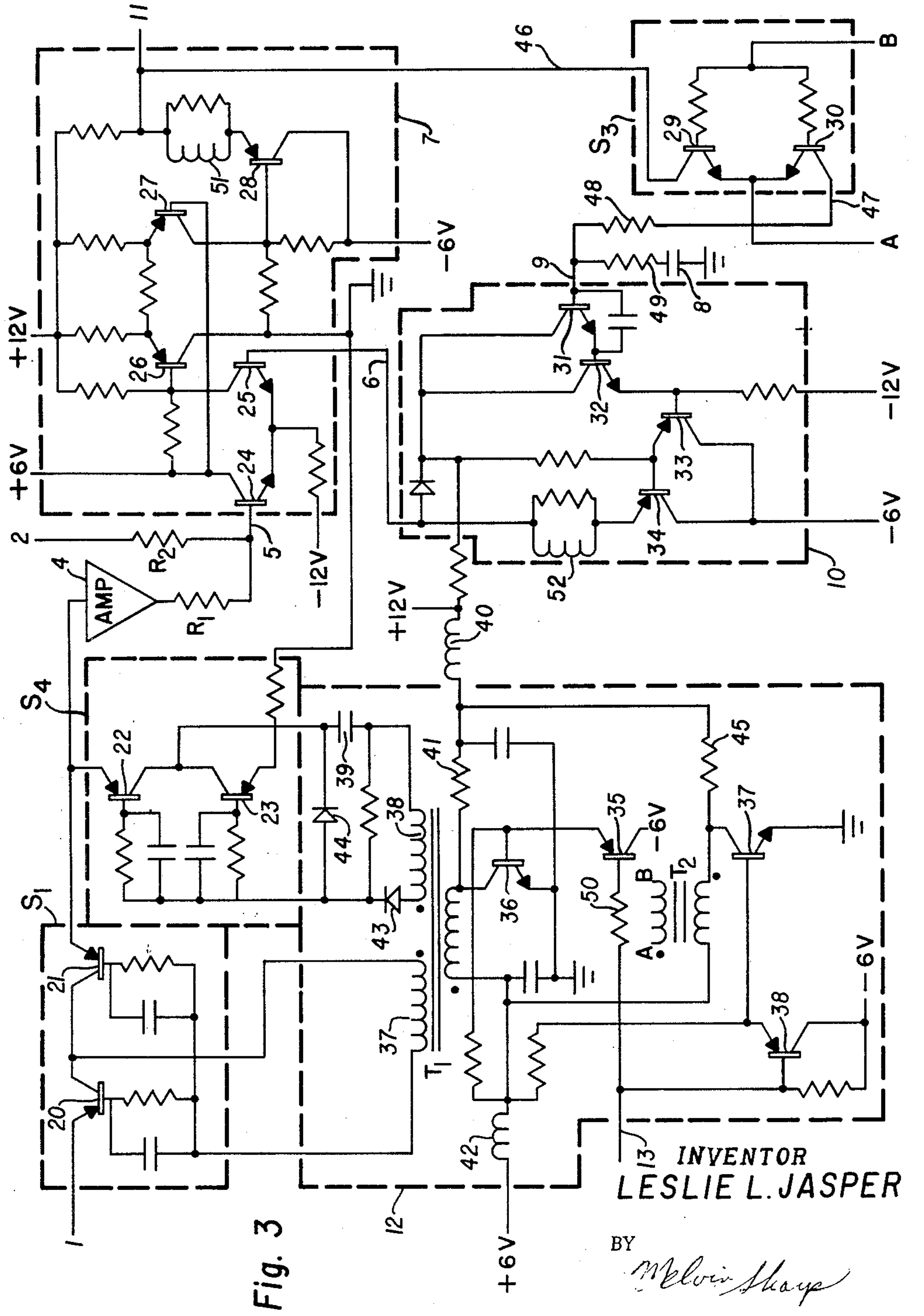
FIG. 3 shows a schematic of the components generally shown in FIG. 2, omitting switch $S_2$.

FIG. 3 shows a detailed schematic of the components in the system organization of FIG. 2. The dashed boxes in FIG. 3, having the same reference numerals as the components in FIGS. 1 or 2, indicate circuits which may be used with either system. Therefore, in FIG. 3, the elements within the dashed boxes 7 and 10 illustrate the circuitry for the compare and hold amplifiers generally shown in FIGS. 1 and 2. Dashed boxes labeled $S_1$, $S_3$ and $S_4$ show one embodiment of the switches in FIG. 2, switch $S_2$ being omitted. The dashed box labeled 12 shows the switch drive circuit.

Transistors 20–21 and 22–23 are in an inverted connection and comprise switches $S_1$ and $S_4$. Transistors 35 and 36 and transformer $T_1$ are the switch drive circuit. Prior to initiating the sample mode, both switches $S_1$ and $S_4$ are off, that is open, due to their collector-to-base threshold potential. At this time, the voltage at 13 should be negative, for example −3 volts, whereby transistor 35 is conducting and transistor 36 is cutoff. The transformer $T_1$ has a square loop core and has current flowing in its primary from the +12 volt source through inductance 40, resistance 41, the primary, inductance 42 and the +6 volt source. This current resets the core upon the termination of the command pulse. To initiate the sample mode, a command pulse such as a positive voltage, +3 volts, 3 microseconds wide is applied at 13.

This pulse turns off transistor 35 and turns on transistor 36, reversing the current in the transformer primary and inducing a constant amplitude voltage pulse in both the transformer secondary windings 37 and 38. Secondary winding 37 produces a forward bias across the collector-to-base junctions of both transistors 20 and 21, turning them on, that is closing switch $S_1$. The pulse produced by secondary winding 38 charges the capacitor 39 to approximately the peak secondary voltage through diodes 43 and 44. Transistors 22 and 23 are reversed biased during the time interval of the command pulse by the voltage drop across diode 44.

At the end of the command pulse time interval, transistors 20 and 21 are biased off. The charge on capacitor 39 forward biases transistors 22 and 23 turning them on. Thus, approximately ground potential is connected to the input of amplifier 4.

Similarly, prior to initiation of the sample mode with a negative voltage at 13, transistor 38 is conducting and transistor 37 is off. Current flows in the primary of transformer $T_2$ from the +12 volt source, inductance 40, resistor 45, the primary of transformer $T_2$, inductance 42 and the +6 volt source. This current resets the core upon the termination of the command pulse. Upon the occurrence of a positive command pulse at 13, transistor 38 is cutoff and transistor 37 is turned on, thus reversing the current flow in the primary of transformer $T_2$. A constant amplitude voltage pulse is produced by the transformer $T_2$ secondary at terminals A and B which turns on transistors 29 and 30. The voltage pulse produced by the transformer $T_2$ secondary forward biases said transistors to effectively coupled leads 46 and 47. At the end of the command pulse time interval, transistor 37 is cutoff causing a reverse bias potential to appear at terminals A and B, opening switch $S_3$.

As described previously, in the sample mode $S_1$ and $S_3$ are closed and $S_4$ is open. The signal $E_1$ at terminal 1 is applied to input 5 through amplifier 4 and voltage divider $R_1$, $R_2$. A fraction of $E_1$ (usually half) is applied to input 5 which is the base of an emitter follower 24. The emitter 24 drives the emitter of grounded base amplifier 25. Transistors 24 and 25 comprise the input of the differential amplifier 7. If $E_1$ is positive, a larger portion of the current flowing through $R_1$ flows through transistor 24 thus reducting the current through transistor 25 causing the base of transistor 26 to go more positive. Transistor 26 is an emitter follower which drives grounded base amplifier 27 causing the input of emitter follower amplifier 28 to go more positive. The output signal is transferred through switch $S_3$ which is closed at this time and charges capacitor 8 through resistors 48 and 49.

When large signal changes are required on capacitor 8, an amplifier can be added bypassing resistor 48 to supply large currents to capacitor 8 when the signal at 46 exceeds a specified threshold.

The charge on capacitor 8 is applied to input 6 through a cascade arrangement of emitter-follower transistors 31—34. The emitter of transistor 34 is coupled to the collector of transistors 31 and 32 through a zener diode for adjusting and maintaining a constant emitter collector voltage for transistors 31 and 32 whereby the collector voltage follows the voltage at 9 for reducing collector to base capacitance. Amplifier 10 is a high current gain amplifier to minimize voltage changes across capacitor 8 during the campare interval.

Therefore, a feedback loop is completed from output 11 to input 6 for amplifier 7 forcing amplifier 7 to operate at a low gain in the sample period. The signal stored by capacitor 8 represents the input voltage at terminal 1 plus offset errors in components 4, 7, $S_3$ and 10.

In the compare mode, $S_1$ and $S_3$ open, $S_4$ closed and $S_2$ connected to terminal 2, the signal applied to terminal 2 is referenced to ground by switch $S_4$ and voltage divider $R_1$, $R_2$. However, the ground reference at the output of amplifier 4 includes the offset error of said amplifier. The input voltage at 5 is compared to the input at 6; therefore, the output at 11 is compensated for offset errors in any component which is common to the signal path for the signals at inputs 5 and 6.

The invention also has utility for comparing a reference signal such as ground with an unknown signal. Said unknown signal may comprise the difference between two signals, for example, the output of a summing network whose inputs are a signal to be coded and a signal from a decoder. Said summing network output may then be a signal having a blank input period with said reference signal and decoding periods with said unknown signal. That is, the output signal of said summing network has a first time period (blank input period) with a ground reference signal and other time periods (conversion periods) with a difference signal (difference between signal to be coded and decoder output). The blank input period is hereinafter referred to as the balance mode. The comparing system for this case operates as follows: The output signal from said summing network is applied directly to input 5 of amplifier 7. In the balance mode, switch $S_3$ closed, a ground reference signal is applied to input 5 thereby charging capacitor 8 to a potential proportional to any offset errors in amplifier 7. In the conversion period or compart mode, switch $S_3$ open, said unknown difference signal is applied to input 5 and compared to the stored signal at input 6. Therefore, any offset error in a component in a path common to said ground reference signal and said unknown difference signal is compensated by the stored signal at input 6 in the compare mode. The switch $S_3$ may be synchronized to open and close in response to a pulse derived from the programmer for the blank and conversion periods.

It is to be understood that the above described embodiments are merely illustrative of the application of the principles of the invention. Numerous other arrangements may be devised by those skilled in the art without departing from the spirit and scope of the invention as defined by the appended claims.

What is claimed is:

1. A system for comparing analog signals comprising differential amplifier means having two inputs and an output, feedback means coupling said output to one of said inputs, said feedback means including serially coupled switch means and amplifying means, said switch means being coupled to said output, storage means coupled to the junction between said switch means and said amplifying means, said switch means being operative to connect and disconnect said feedback means, whereby said differential amplifier means has a low and high gain respectively, means for applying an analog signal to the other of said inputs, said means for applying an analog signal to the other of said inputs including input switch means for sampling said analog signal and means having a high input impedance and a low output impedance coupling said input switch means to said other of said inputs, another input switch means coupled to said means having a high input impedance and a low output impedance, and switching means for coupling a reference potential to said means having a high input impedance and a low output impedance.

2. The system of claim 1, wherein said means for applying an analog signal to the other of said inputs includes a voltage divider having two terminals and a junction, said junction being coupled to said other of said inputs and one terminal coupled to said means having a high input impedance and a low output impedance.

References Cited in the file of this patent

UNITED STATES PATENTS

| | | |
|---|---|---|
| 2,834,883 | Lukoff | May 13, 1958 |
| 3,050,673 | Widmer | Aug. 21, 1962 |